United States Patent [19]
Yano et al.

[11] Patent Number: 6,022,804
[45] Date of Patent: Feb. 8, 2000

[54] SEMICONDUCTOR DEVICE AND ITS MANUFACTURING METHOD

[75] Inventors: Kousaku Yano; Tetauya Ueda, both of Osaka, Japan

[73] Assignee: Matsushita Electric Industrial Co., Ltd., Osaka, Japan

[21] Appl. No.: 09/024,456

[22] Filed: Feb. 17, 1998

Related U.S. Application Data

[62] Division of application No. 08/834,303, Feb. 18, 1997, Pat. No. 5,760,429, which is a continuation of application No. 08/598,281, Feb. 8, 1996, abandoned, which is a continuation of application No. 08/250,452, May 27, 1994, abandoned.

[30] Foreign Application Priority Data

Jun. 1, 1993 [JP] Japan ................................. 5-130339

[51] Int. Cl.[7] .................................................. H01L 21/768
[52] U.S. Cl. ........................... 438/675; 438/620; 438/622; 438/624; 438/637; 438/618
[58] Field of Search .................................... 438/620, 622, 438/623, 624, 637, 618, 675

[56] References Cited

U.S. PATENT DOCUMENTS

| | | | |
|---|---|---|---|
| 4,840,923 | 6/1989 | Flagello et al. | 438/620 |
| 4,872,050 | 10/1989 | Okamoto et al. | 357/71 |

FOREIGN PATENT DOCUMENTS

| | | |
|---|---|---|
| 0374971 | 12/1989 | Japan . |
| 4188753 | 7/1992 | Japan . |
| 569308 | 9/1993 | Japan . |

*Primary Examiner*—Charles Bowers
*Assistant Examiner*—Thanh Nguyen
*Attorney, Agent, or Firm*—McDermott, Will & Emery

[57] ABSTRACT

An integrated circuit having a multi-layered metal wiring structure with interlayer insulating films therebetween. A small cutout is made in a metal wiring when it is desirous to have the metal wiring touch a contact formed in a through hole passing through said cutout. A larger cutout is made in a metal wiring when it is desirous to have the metal wiring remain spaced from a contact formed in a through hole passing through said cutout.

9 Claims, 11 Drawing Sheets

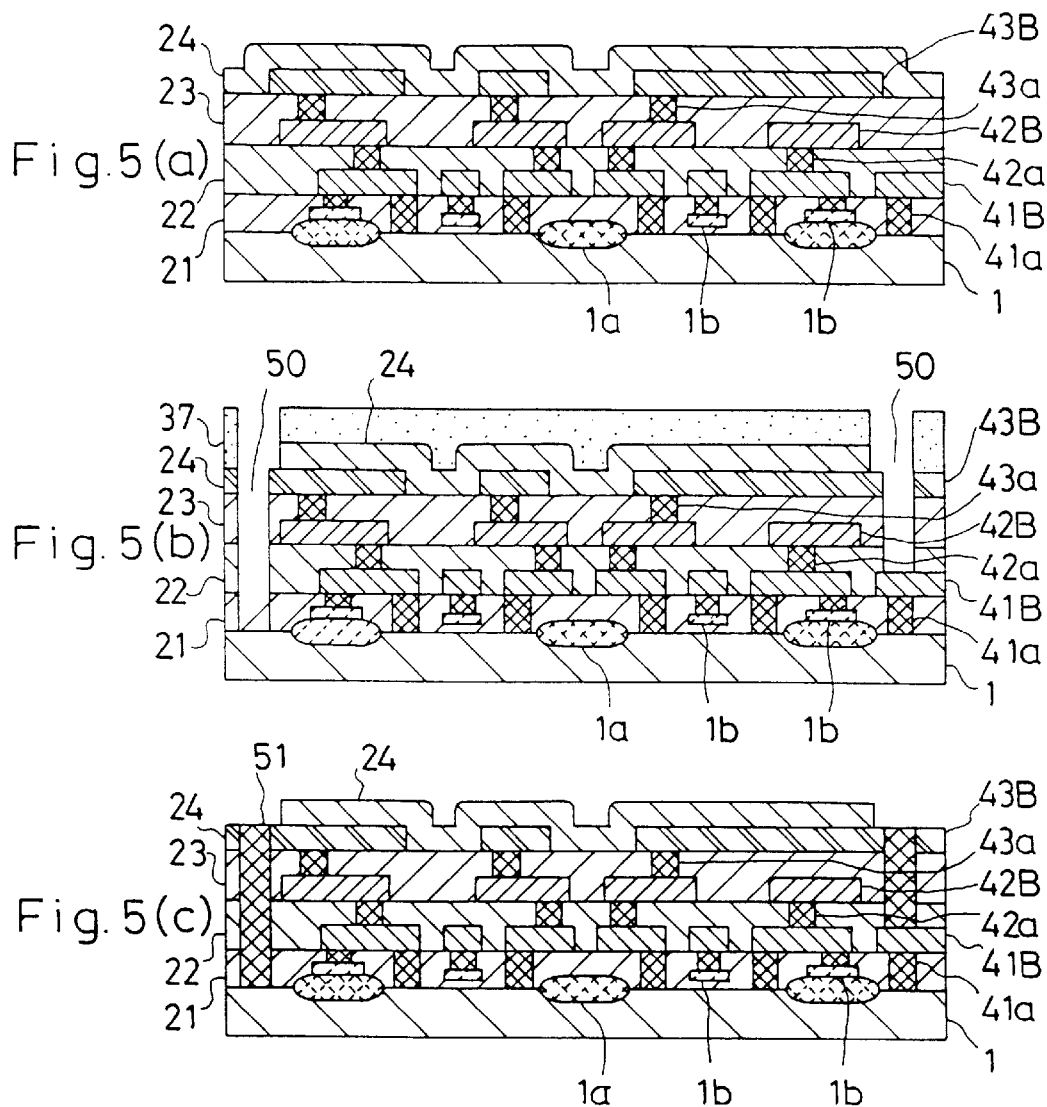

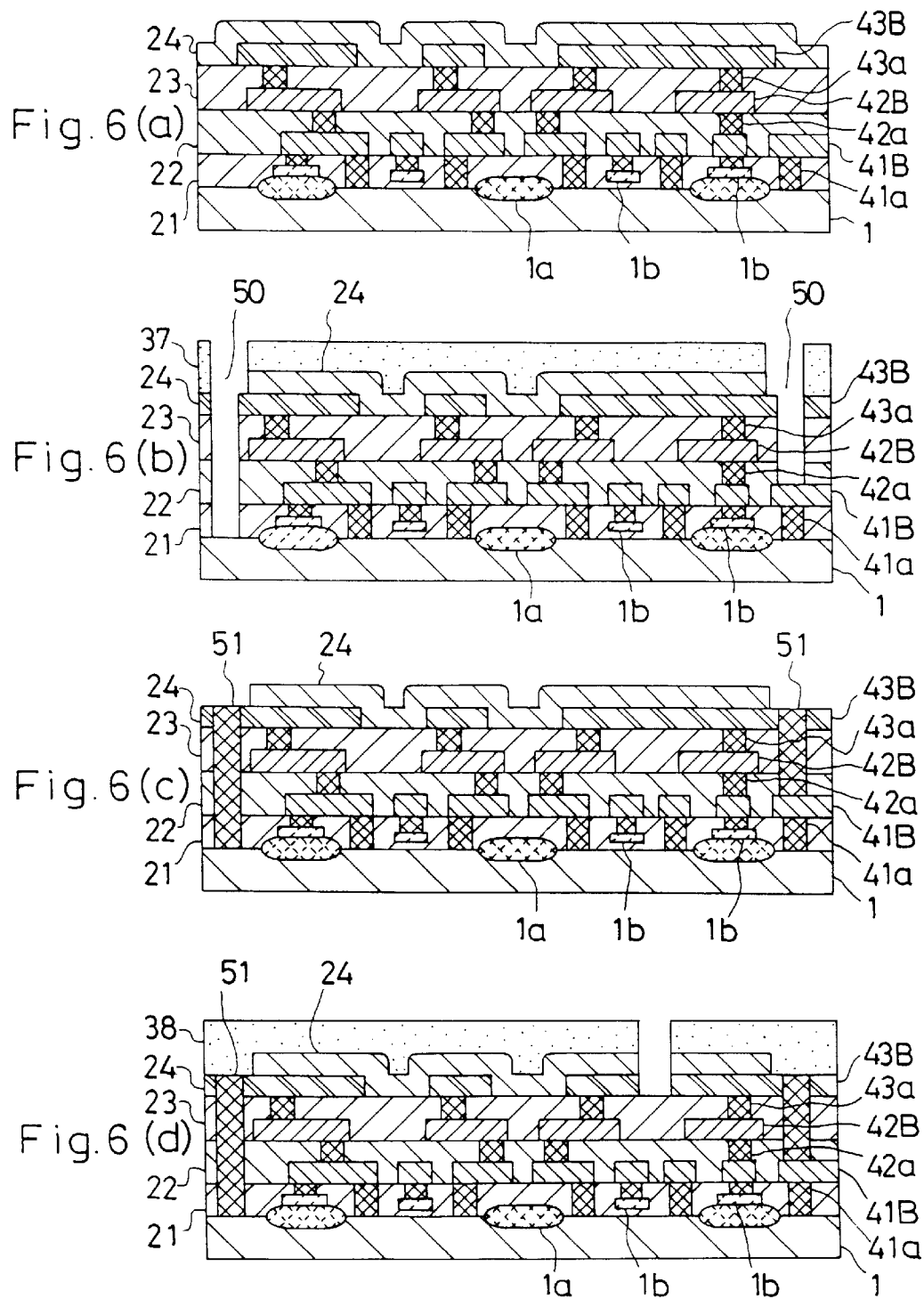

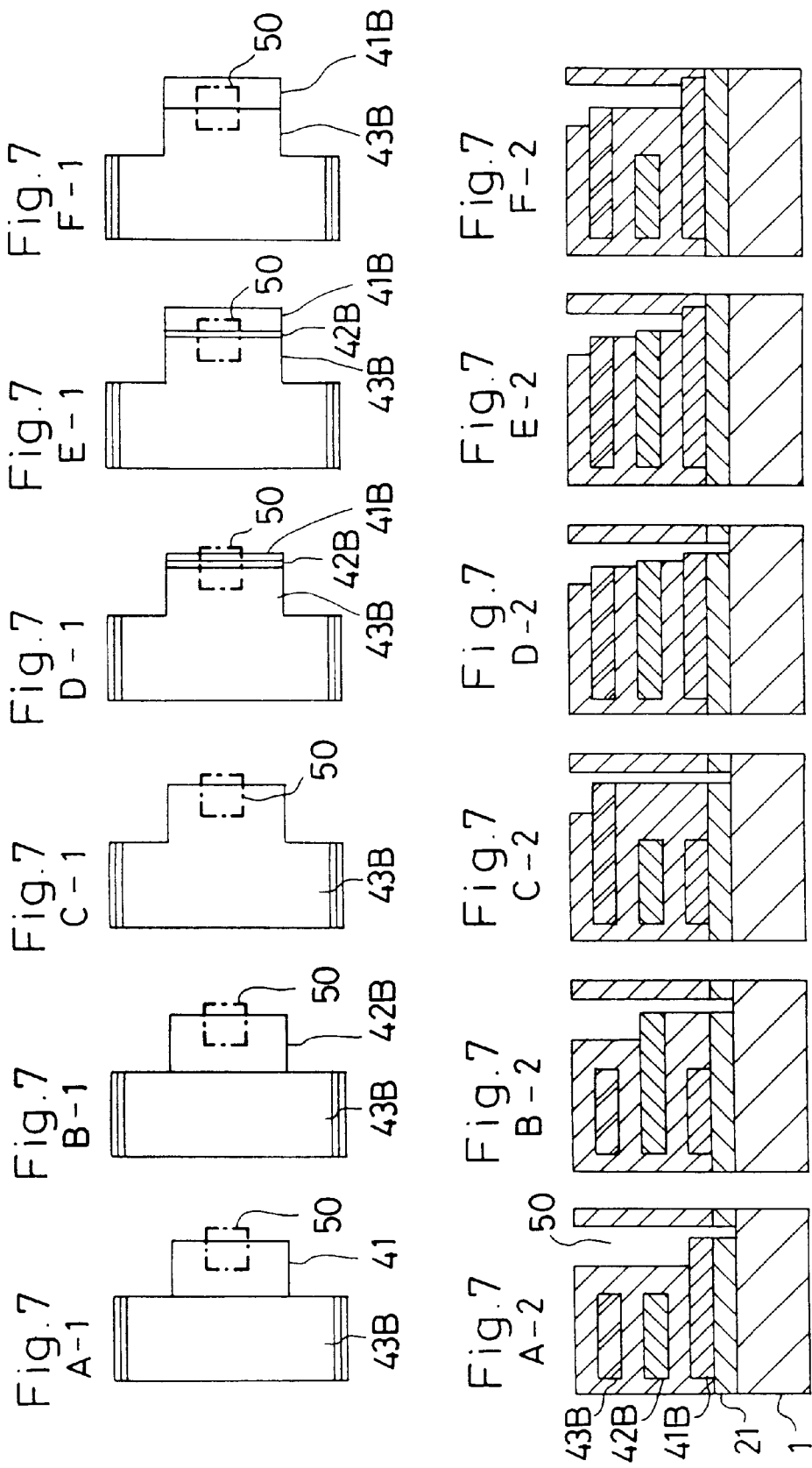

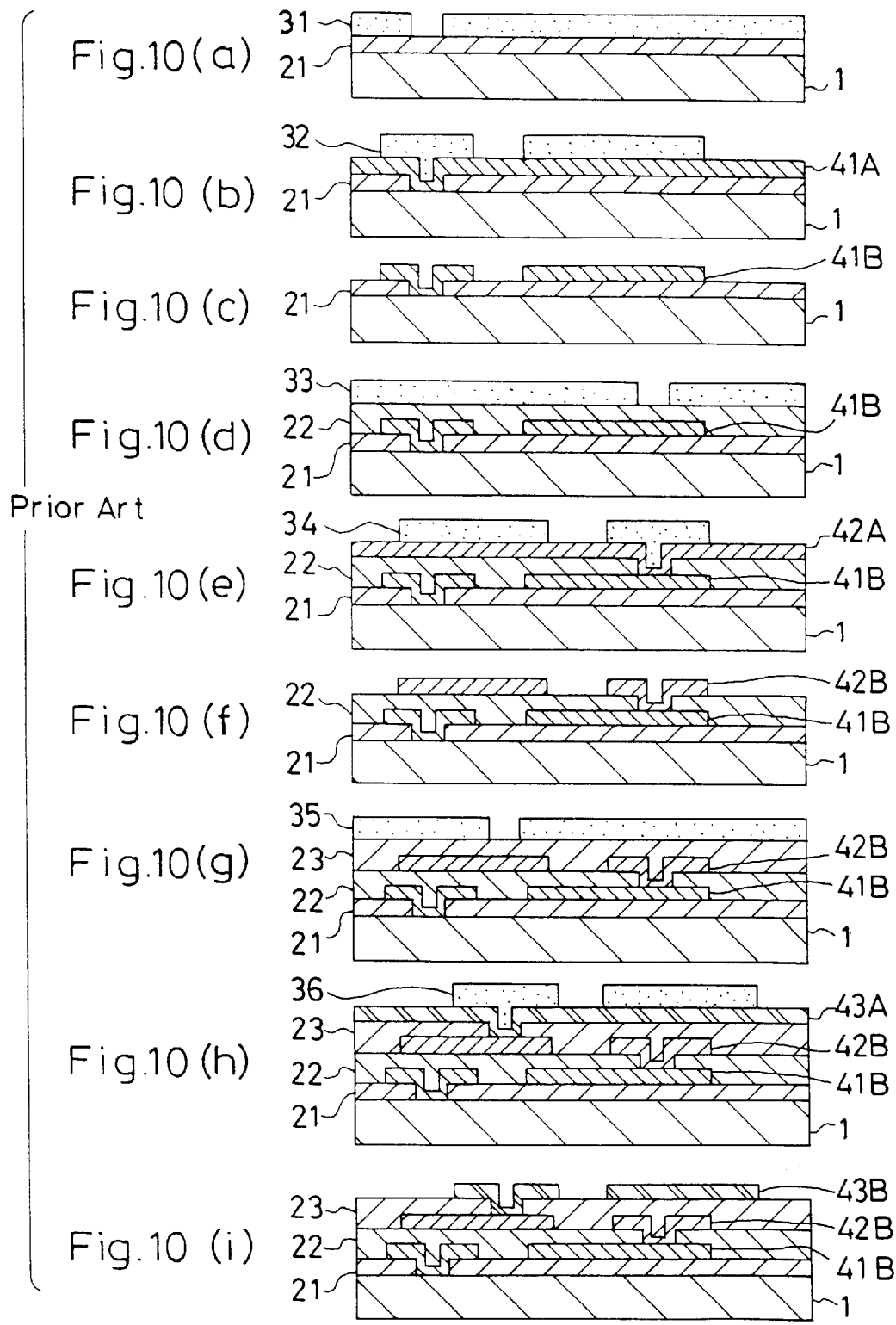

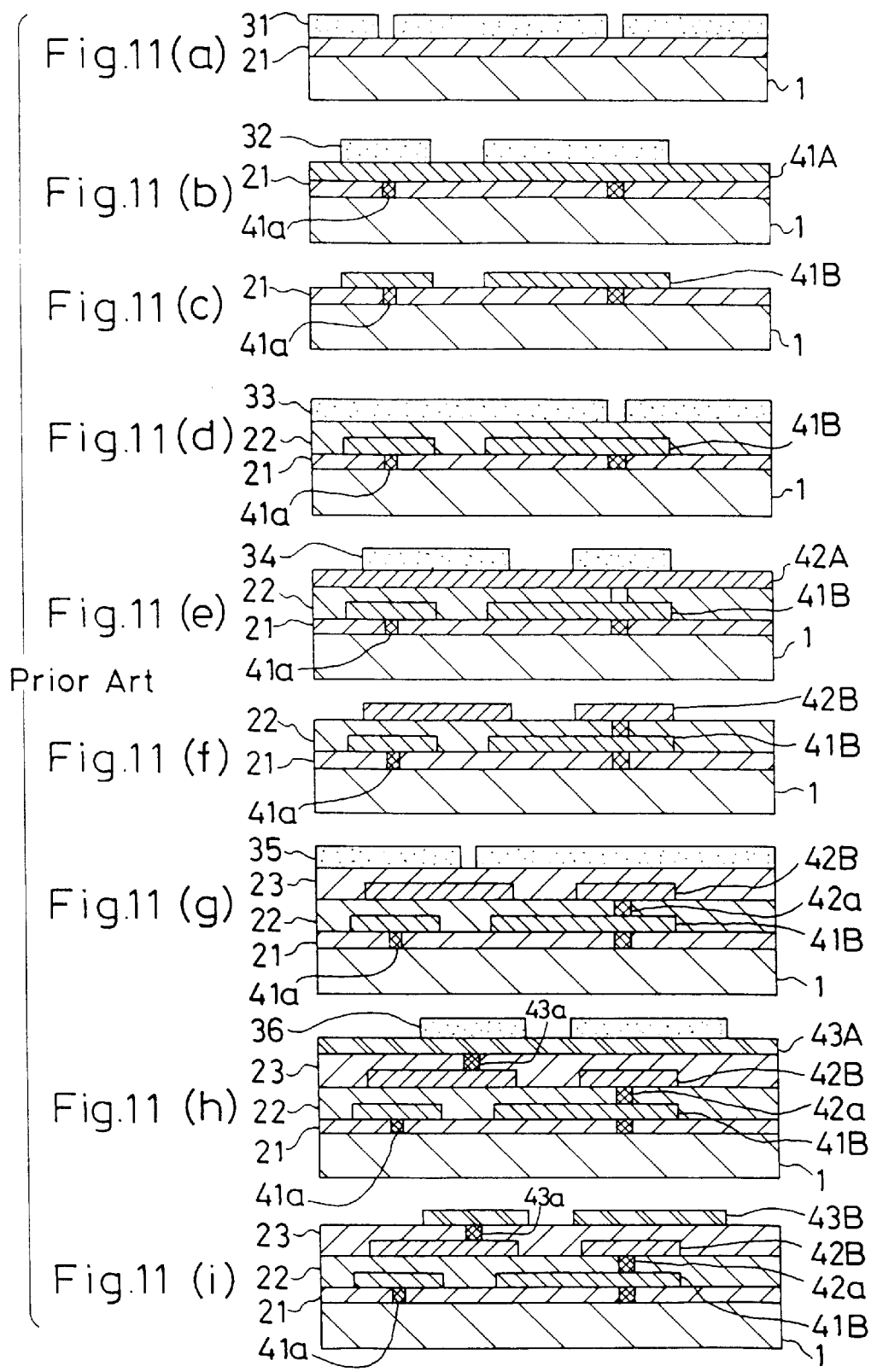

SEMICONDUCTOR DEVICE AND ITS MANUFACTURING METHOD

This is a divisional application of Ser. No. 8/834,303, filed Feb. 18, 1997, U.S. Pat. No. 5,760,429, which is a File Wrapper Continuation application of Ser. No. 08/598,281, filed Feb. 8, 1996, now abandoned, which was a File Wrapper Continuation application of Ser. No. 08/250,452, filed May 27, 1994, also now abandoned.

BACKGROUND OF THE INVENTION

The present invention relates to a semiconductor device, such as a very large scale integrated circuit (VLSI), which has a plurality of metal wiring layers, and its manufacturing method.

Recent advanced semiconductor devices, such as VLSI and the like, employ a multi-layer metal wiring structure consisting of a plurality of layers of metal wiring, as a result of progress of large-scale integration technologies.

One example of such a conventional semiconductor device is a three-layer wiring structure semiconductor device whose structure and manufacturing method will be explained below with reference to FIG. 9.

FIG. 9 shows a cross-sectional view of the conventional three-layer wiring structure semiconductor device comprising a silicon substrate 1 provided with a diffusion region, a gate electrode, a polycide electrode, a salicide electrode and a separating electrode, a BPSG film 21 performing as an insulating film formed on the silicon substrate 1, and a first-layer metal wiring 41B formed on the BPSG film 21. A second-layer metal wiring 42B is formed on a first inter-layer insulating film 22, which is formed on the first-layer metal wiring 41B. A third-layer metal wiring 43B is formed on a second inter-layer insulating film 23, which is formed on the second-layer metal wiring 42B. Such a three-layer metal wiring structure, as shown in FIG. 9, allows a total of 10 kinds of connecting patterns among the first- to third-layer metal wirings and the silicon substrate. In the drawing, A represents a connecting pattern conducting the substrate 1 and the first-layer metal wiring 41B, B represents a connecting pattern conducting the first-layer metal wiring 41B and the second-layer metal wiring 42B, C represents a connecting pattern conducting the second-layer metal wiring 42B and the third-layer metal wiring 43B, D represents a connecting pattern conducting the substrate 1 and the first- and second-layer metal wirings 41B, 42B, E represents a connecting pattern conducting the substrate 1 and the first-, second- and third-layer metal wirings 41B, 42B, 43B, F represents a connecting pattern conducting the substrate 1 and the second-layer metal wiring 42B, G represents a connecting pattern conducting the substrate 1 and the second- and third-layer metal wiring 42B, 43B, H represents a connecting pattern conducting the first-layer metal wiring 41B and the third-layer metal wiring 43B, I represents a connecting pattern conducting the substrate 1 and the first- and third-layer wirings 41B, 43B, and J represents a connecting pattern conducting the substrate 1 and the third-layer metal wiring 43B.

Of the 10 connecting patterns above-explained, five of A to E are generally used in practical semiconductor devices.

Hereinafter, conventional three-layer wiring structure semiconductor devices and their manufacturing methods will be explained with reference to FIGS. 10(a)–10(i) and 11(a)–11(i).

FIGS. 10(a)–10(i) show a first conventional semiconductor device and its manufacturing method, wherein the first conventional semiconductor device comprises the above-described five, A to E, connecting patterns.

First, as illustrated in FIG. 10(a), the BPSG film 21, performing as an insulating film, is deposited on the semiconductor substrate 1 which is provided with a transistor region and others. After that, thermal treatment is applied on the BPSG film 21 to planarize the surface of the BPSG film 21 by softening glass. Then, using photolithography technology, a desired-shaped resist pattern 31 is formed on the BPSG film 21.

Next, as illustrated in FIG. 10(b), etching is applied on the BPSG film 21 using a mask of the resist pattern 31, thus forming a contact portion at a predetermined position on the BPSG film 21. Thereafter, the resist pattern 31 is removed and the surface of the BPSG film 21 is cleaned. Then, a first-layer metal film 41A, being composed of titanium film, titanium nitriding film and aluminum alloy film, is formed by sputtering on the BPSG film 21. Subsequently, using photolithography technology, a resist pattern 32 is formed on the first-layer metal film 41A for forming a desired wiring pattern.

Next, as illustrated in FIG. 10(c), etching is applied on the first-layer metal film 41A using a mask of the resist pattern 32, thus forming a first-layer metal wiring 41B. The resist pattern 32 is then removed and the surface of the first-layer metal wiring 41B is cleaned.

Subsequently, as illustrated in FIG. 10(d), a first inter-layer insulating film 22 having a plane surface is formed on the first-layer metal wiring 41B. A resist pattern 33, providing a through hole connecting the first-layer metal wiring 41B and a second-layer metal wiring 42B, is formed on the first inter-layer insulating film 22.

Next, as illustrated in FIG. 10(e), etching is applied on the first inter-layer insulating film 22 using a mask of the resist pattern 33, thereby forming the through hole connecting the first-layer metal wiring 41B and the second-layer metal wiring 42B. The resist pattern 33 is then removed and the first inter-layer insulating film 22 is cleaned. Then, a second-layer metal film 42A, being composed of titanium film, titanium nitriding film and aluminum alloy film, is formed by sputtering on the first inter-layer insulating film 22. Subsequently, using photolithography technology, a resist pattern 34 is formed on the second-layer metal film 42A for forming a desired wiring pattern.

Next, as illustrated in FIG. 10(f), etching is applied on the second-layer metal film 42A using a mask of the resist pattern 34, thus forming a second-layer metal wiring 42B. The resist pattern 34 is then removed and the surface of the second-layer metal wiring 42B is cleaned.

Subsequently, as illustrated in FIG. 10(g), a second inter-layer insulating film 23 having a plane surface is formed on the second-layer metal wiring 42B. A resist pattern 35, providing a through hole connecting the second-layer metal wiring 42B and a third-layer metal wiring 43B, is formed on the second inter-layer insulating film 23.

Next, as illustrated in FIG. 10(h), etching is applied on the second inter-layer insulating film 23 using a mask of the resist pattern 35, thereby forming the through hole connecting the second-layer metal wiring 42B and the third-layer metal wiring 43B. The resist pattern 35 is then removed and the second inter-layer insulating film 23 is cleaned. Then, a third-layer metal film 43A, being composed of titanium film, titanium nitriding film and aluminum alloy film, is formed by sputtering on the second inter-layer insulating film 23. Subsequently, using photolithography technology, a resist pattern 36 is formed on the third-layer metal film 43A for forming a desired wiring pattern.

Finally, as illustrated in FIG. 10(*i*), etching is applied on the third-layer metal film 43A using a mask of the resist pattern 36, thus forming the third-layer metal wiring 43B. The resist pattern 36 is then removed and the third-layer metal wiring 43B is cleaned. In this manner, the three-layer metal wiring structure is completed.

FIGS. 11(*a*)–11(*i*) show a second conventional semiconductor device and its manufacturing method. The multi-layer metal wiring structure of this conventional second semiconductor device is preferably used for large-scale integration of semiconductor device. Formation of metal wiring using only sputtering as shown in FIGS. 10(*a*)–10(*i*) tends to encounter with a problem of causing open circuit when a contact or a through hole is small and deep since wiring metal may fail to enter into such a thin and deep through hole. To prevent this kind of electric disconnection, the second conventional semiconductor device forms contacts 41*a*, 42*a* and 43*a* containing tungsten (W) by the chemical vapor deposition (abbreviated as CVD) method after forming the contact or through hole. This is because the CVD method has better applicability for coating of stepped portions. Therefore, a space of the contact or through hole is surely filled with tungsten (W). In FIGS. 11(*a*)–11(*i*), the same parts as those of FIGS. 10(*a*)–10(*i*) are denoted by identical reference numbers, and will be no more explained.

According to this second conventional semiconductor device, contact and through holes are formed on the connecting region of the substrate or the lower-layer metal wiring, and these contact and through holes are filled with metal material or tungsten W, constituting the upper-layer metal wiring.

However, the above-described first conventional semiconductor device requires a total of 24 steps in the formation of multi-layer metal wiring structure, while the second conventional semiconductor device requires a total of 27 steps in the formation of multi-layer metal wiring structure. The percentage of these steps for formation of multi-layer metal wiring structure is therefore very large in an overall manufacturing process of an LSI. An increase of one metal wiring layer is accompanied by an increase of 7 to 8 manufacturing steps. Utilization of complicated and expensive machines, such as inter-layer insulating film forming machines, sputtering machines, CVD devices for tungsten, directly results in the increase of manufacturing cost.

To reduce the number of steps for manufacturing the multi-layer metal wiring structure, Japanese Patent No. HEI 569308/1993 discloses the method of mutually connecting a substrate, a lower-layer metal wiring, an intermediate-layer metal wiring and an upper-layer metal wiring by providing a ring-shaped connecting portion on the upper-layer metal wiring, forming a through hole extending normally from the central hole of the connecting portion to the substrate, and filling the through hole with metal material to form a contact.

According to the method disclosed in Japanese Patent No. HEI 5-69308/1993, the number of steps of manufacturing a multi-layer metal wiring is reduced. However, the outer diameter of the ring-shaped connecting portion becomes large. It means that the ring-shaped connecting portion requires a large area, which encounters with positional restrictions in providing the connecting portion.

Especially, when the upper-layer metal wiring is directly connected to the substrate or the lower-layer metal wiring without connecting to the intermediate-layer metal wiring, the through hole needs to pass through the central hole formed on the connecting portion of the intermediate-layer metal wiring so as not to be brought into contact with the connecting portion. Consequently, the connecting portion of the intermediate-layer metal wiring is so enlarged that it encounters with severe positional restrictions in provision.

SUMMARY OF THE INVENTION

Accordingly, in view of above-described problems encountered in the prior art, an object of the present invention is to reducing the number of manufacturing steps for forming a multi-layer metal wiring structure without being subjected to positional restrictions in the provision of connecting portions.

In order to accomplish above and other objects, a first aspect of the present invention provides a semiconductor device comprising: a lower-layer metal wiring formed on an insulating film provided on a semiconductor substrate; an intermediate-layer metal wiring formed on a first inter-layer insulating film provided on the lower-layer metal wiring; an upper-layer metal wiring formed on a second inter-layer insulating film provided on the intermediate-layer metal wiring; a lower-layer cutout portion provided at a predetermined position on the lower-layer metal wiring, the lower-layer cutout portion being formed by partly removing the lower-layer metal wiring; an intermediate-layer cutout portion provided on the intermediate-layer metal wiring at a position above the lower-layer cutout portion, the intermediate-layer cutout portion being formed by partly removing the intermediate-layer metal wiring to have a size smaller than that of the lower-layer cutout portion; a through hole extending perpendicularly to a surface of the semiconductor substrate so as to penetrate the insulating film, the lower-layer cutout portion, the first inter-layer insulating film, the intermediate-layer cutout portion and the second inter-layer insulating film, the lower-layer cutout portion exposing no wall surface thereof to the through hole while the intermediate-layer cutout portion exposing a wall surface thereof to the through hole; and a contact composed of metal material filled in the through hole and connected at a lower end thereof with the semiconductor substrate.

A second aspect of the present invention provides a semiconductor device comprising: a lower-layer metal wiring formed on an insulating film provided on a semiconductor substrate; an intermediate-layer metal wiring formed on a first inter-layer insulating film provided on the lower-layer metal wiring; an upper-layer metal wiring formed on a second inter-layer insulating film provided on the intermediate-layer metal wiring; a lower-layer cutout portion provided at a predetermined position on the lower-layer metal wiring, the lower-layer cutout portion being formed by partly removing the lower-layer metal wiring; an intermediate-layer cutout portion provided on the intermediate-layer metal wiring at a position above the lower-layer cutout portion, the intermediate-layer cutout portion being formed by partly removing the intermediate-layer metal wiring to have a size larger than that of the lower-layer cutout portion; a through hole extending perpendicularly to a surface of the semiconductor substrate so as to penetrate the insulating film, the lower-layer cutout portion, the first inter-layer insulating film, the intermediate-layer cutout portion and the second inter-layer insulating film, the lower-layer cutout portion exposing a wall surface thereof to the through hole while the intermediate-layer cutout portion exposing no wall surface thereof to the through hole; and a contact composed of metal material filled in the through hole and connected at a lower end thereof with the semiconductor substrate.

A third aspect of the present invention provides a semiconductor device comprising: a lower-layer metal wiring formed on an insulating film provided on a semiconductor substrate; an intermediate-layer metal wiring formed on a first inter-layer insulating film provided on the lower-layer metal wiring; an upper-layer metal wiring formed on a second inter-layer insulating film provided on the intermediate-layer metal wiring; a lower-layer cutout portion provided at a predetermined position on the lower-layer metal wiring, the lower-layer cutout portion being formed by partly removing the lower-layer metal wiring; an intermediate-layer cutout portion provided on the intermediate-layer metal wiring at a position above the lower-layer cutout portion, the intermediate-layer cutout portion being formed by partly removing the intermediate-layer metal wiring to have a size larger than that of the lower-layer cutout portion; a through hole extending perpendicularly to a surface of the semiconductor substrate so as to penetrate the insulating film, the lower-layer cutout portion, the first inter-layer insulating film, the intermediate-layer cutout portion and the second inter-layer insulating film, the lower-layer cutout portion and the intermediate-layer cutout portion exposing wall surfaces thereof to the through hole; and a contact composed of metal material filled in the through hole and connected at a lower end thereof with the semiconductor substrate.

Above first to third aspects of the present invention require only one etching step for forming the through hole on the insulating film, first and second inter-layer insulating films and only one step of filling metal material in the through hole. Therefore, the number of steps for forming a multi-layer wiring structure is greatly reduced compared with the conventional method, because it is not necessary to form the contact hole separately on each of the insulating film, the first and second inter-layer insulating films and then fill metal in each through hole thus formed.

According to these first to third aspects of the present invention, the through hole extends perpendicularly to the surface of the semiconductor substrate so as to penetrate the lower-layer cutout portion formed on the lower-layer metal wiring and the intermediate-layer metal wiring. Therefore, no wide space is required for the through hole.

According to the first aspect of the present invention, the lower-layer cutout portion does not expose its wall surface to the through hole while the intermediate-layer cutout portion exposes its wall surface to the through hole. The contact connects the semiconductor substrate and the intermediate-layer metal wiring without being connected with the lower-layer metal wiring. Accordingly, it becomes possible, with the smaller manufacturing steps and without encountering the positional restriction in providing the through hole, to realize a multi-layer metal wiring structure comprising a contact connecting the semiconductor substrate and the intermediate-layer metal wiring which is not connected with the lower-layer metal wiring.

According to the second aspect of the present invention, the intermediate-layer cutout portion does not expose its wall surface to the through hole while the lower-layer cutout portion exposes its wall surface to the thorough hole. The contact connects the semiconductor substrate and the lower-layer metal wiring without being connected with the intermediate-layer metal wiring. Accordingly, it becomes possible, with the smaller manufacturing steps and without encountering the positional restriction in providing the through hole, to realize a multi-layer metal wiring structure comprising a contact connecting the semiconductor substrate and the lower-layer metal wiring which is not connected with the intermediate-layer metal wiring.

According to the third aspect of the present invention, the intermediate-layer cutout portion and the lower-layer cutout portion expose their wall surfaces to the through hole. The contact connects the semiconductor substrate, the intermediate-layer metal wiring and the lower-layer metal wiring. Accordingly, it becomes possible, with the smaller manufacturing steps and without encountering the positional restriction in providing the through hole, to realize a multi-layer metal wiring structure comprising a contact connecting the semiconductor substrate, the intermediate-layer metal wiring and the lower-layer metal wiring.

A fourth aspect of the present invention provides a semiconductor device comprising: a lower-layer metal wiring formed on an insulating film provided on a semiconductor substrate; an intermediate-layer metal wiring formed on a first inter-layer insulating film provided on the lower-layer metal wiring, the intermediate-layer metal wiring having a side surface offset from a side surface of the lower-layer metal wiring; an upper-layer metal wiring formed on a second inter-layer insulating film provided on the intermediate-layer metal wiring; a through hole extending perpendicularly to a surface of the semiconductor substrate so as to penetrate the insulating film, the first inter-layer insulating film and the second inter-layer insulating film, the lower-layer metal wiring exposing no side surface thereof to the through hole while the intermediate-layer metal wiring exposing the side surface thereof to the through hole; and a contact composed of metal material filled in the through hole and connected at a lower end thereof with the semiconductor substrate.

A fifth aspect of the present invention provides a semiconductor device comprising: a lower-layer metal wiring formed on an insulating film provided on a semiconductor substrate; an intermediate-layer metal wiring formed on a first inter-layer insulating film provided on the lower-layer metal wiring, the intermediate-layer metal wiring having a side surface offset from a side surface of the lower-layer metal wiring; an upper-layer metal wiring formed on a second inter-layer insulating film provided on the intermediate-layer metal wiring; a through hole extending perpendicularly to a surface of the semiconductor substrate so as to penetrate the insulating film, the first inter-layer insulating film and the second inter-layer insulating film, the lower-layer metal wiring exposing the side surface thereof to the through hole while the intermediate-layer metal wiring exposing no side surface thereof to the through hole; and a contact composed of metal material filled in the through hole and connected at a lower end thereof with the semiconductor substrate.

A sixth aspect of the present invention provides a semiconductor device comprising: a lower-layer metal wiring formed on an insulating film provided on a semiconductor substrate; an intermediate-layer metal wiring formed on a first inter-layer insulating film provided on the lower-layer metal wiring, the intermediate-layer metal wiring having a side surface offset from a side surface of the lower-layer metal wiring; an upper-layer metal wiring formed on a second inter-layer insulating film provided on the intermediate-layer metal wiring; a through hole extending perpendicularly to a surface of the semiconductor substrate so as to penetrate the insulating film, the first inter-layer insulating film and the second inter-layer insulating film, the lower-layer metal wiring and the intermediate-layer metal wiring exposing the side surfaces thereof to the through hole; and a contact composed of metal material filled in the through hole and connected at a lower end thereof with the semiconductor substrate.

According to fourth to sixth aspects of the present invention, the through hole extends perpendicularly to the surface of the substrate so as to pass through each side of lower-layer and intermediate-layer metal wirings. Therefore, no wide space is required for the through hole.

According to the fourth aspect of the present invention, it becomes possible, with the smaller manufacturing steps and without encountering the positional restriction in providing the through hole, to realize a multi-layer metal wiring structure comprising a contact connecting the semiconductor substrate and the intermediate-layer metal wiring which is not connected with the lower-layer metal wiring.

According to the fifth aspect of the present invention, it becomes possible, with the smaller manufacturing steps and without encountering the positional restriction in providing the through hole, to realize a multi-layer metal wiring structure comprising a contact connecting the semiconductor substrate and the lower-layer metal wiring which is not connected with the intermediate-layer metal wiring.

According to the sixth aspect of the present invention, it becomes possible, with the smaller manufacturing steps and without encountering the positional restriction in providing the through hole, to realize a multi-layer metal wiring structure comprising a contact connecting the semiconductor substrate, the intermediate-layer metal wiring and the lower-layer metal wiring.

In the semiconductor devices according to the first to sixth aspects of the present invention, it is preferable that the contact is connected at an upper end thereof with the upper-layer metal wiring. By doing so, it becomes possible, without increasing the number of manufacturing steps, to realize a multi-layer metal wiring structure wherein the metal wiring connected to the contact, i.e. the intermediate- and/or lower-layer metal wirings, is also connected with the upper-layer metal wiring.

Furthermore, in the semiconductor devices according to the first to sixth aspects of the present invention, it is preferable that the contact is connected at the lower end thereof with an active region formed on the semiconductor substrate. By doing so, it becomes possible, without increasing the number of manufacturing steps, to realize a multi-layer metal wiring structure wherein the metal wiring connected to the contact, i.e. the intermediate- and/or lower-layer metal wirings, is also connected with the active region formed on the semiconductor substrate.

Yet furthermore, in the semiconductor devices according to the first to sixth aspects of the present invention, it is preferable that the contact is connected at the lower end thereof with an electrode formed on the semiconductor substrate. By doing so, it becomes possible, without increasing the number of manufacturing steps, to realize a multi-layer metal wiring structure wherein the metal wiring connected to the contact, i.e. the intermediate- and/or lower-layer metal wirings, is also connected with the electrode formed on the semiconductor substrate.

Moreover, in the semiconductor devices according to the first to third aspects of the present invention, it is preferable that the semiconductor device further comprises another intermediate-layer cutout portion formed on the intermediate-layer metal wiring at a position different from that of the intermediate-layer cutout; another through hole extending perpendicularly to the surface of the semiconductor substrate so as to penetrate the first inter-layer insulating film, the another intermediate-layer cutout portion and the second inter-layer insulating film, the another intermediate-layer cutout portion exposing a wall surface thereof to the another through hole; and another contact composed of metal material filled in the another through hole and connected at a lower end thereof with the lower-layer metal wiring. By doing so, it becomes possible, without increasing the number of manufacturing steps, to realize a multi-layer metal wiring structure wherein the intermediate- and lower-layer wirings are connected by the contact which is not electrically connected with the semiconductor substrate, since the another contact is connected with the intermediate-layer metal wiring.

Furthermore, a seventh aspect of the present invention provides a manufacturing method of a semiconductor device comprising: a step of forming an insulating film on a semiconductor substrate; a step of forming a lower-layer metal wiring on the insulating film, the lower-layer metal wiring having a lower-layer cutout portion being formed by partly removing the lower-layer metal wiring at predetermined position on the lower-layer metal wiring; a step of forming a first inter-layer insulating film on the lower-layer metal wiring; a step of forming an intermediate-layer metal wiring on the first inter-layer insulating film, the intermediate-layer metal wiring having an intermediate-layer cutout portion being formed by partly removing the intermediate-layer metal wiring at a position above the lower-layer cutout portion, the intermediate-layer cutout portion having a size smaller than that of the lower-layer cutout portion; a step of forming a second inter-layer insulating film on the intermediate-layer metal wiring; a step of forming a through hole which extends perpendicularly to a surface of the semiconductor substrate so as to penetrate the insulating film, the lower-layer cutout portion, the first inter-layer insulating film, the intermediate-layer cutout portion and the second inter-layer insulating film, the lower-layer cutout portion exposing no wall surface thereof to the through hole while the intermediate-layer cutout portion exposing a wall surface thereof to the through hole; a step of forming a contact composed of metal material filled in the through hole and connected at a lower end thereof with the semiconductor substrate; and a step of forming an upper-layer metal wiring on the second inter-layer insulating film.

An eighth aspect of the present invention provides a manufacturing method of a semiconductor device comprising: a step of forming an insulating film on a semiconductor substrate; a step of forming a lower-layer metal wiring on the insulating film, the lower-layer metal wiring having a lower-layer cutout portion being formed by partly removing the lower-layer metal wiring at predetermined position on the lower-layer metal wiring; a step of forming a first inter-layer insulating film on the lower-layer metal wiring; a step of forming an intermediate-layer metal wiring on the first inter-layer insulating film, the intermediate-layer metal wiring having an intermediate-layer cutout portion being formed by partly removing the intermediate-layer metal wiring at a position above the lower-layer cutout portion, the intermediate-layer cutout portion having a size larger than that of the lower-layer cutout portion; a step of forming a second inter-layer insulating film on the intermediate-layer metal wiring; a step of forming a through hole which extends perpendicularly to a surface of the semiconductor substrate so as to penetrate the insulating film, the lower-layer cutout portion, the first inter-layer insulating film, the intermediate-layer cutout portion and the second inter-layer insulating film, the lower-layer cutout portion exposing a wall surface thereof to the through hole while the intermediate-layer cutout portion exposing no wall surface thereof to the through hole; a step of forming a contact composed of metal material filled in the through hole and connected at a lower end thereof with the semiconductor substrate; and a step of forming an upper-layer metal wiring on the second inter-layer insulating film.

A ninth aspect of the present invention provides a manufacturing method of a semiconductor device comprising: a step of forming an insulating film on a semiconductor substrate; a step of forming a lower-layer metal wiring on the insulating film, the lower-layer metal wiring having a lower-layer cutout portion being formed by partly removing the lower-layer metal wiring at predetermined position on the lower-layer metal wiring; a step of forming a first inter-layer insulating film on the lower-layer metal wiring; a step of forming an intermediate-layer metal wiring on the first inter-layer insulating film, the intermediate-layer metal wiring having an intermediate-layer cutout portion being formed by partly removing the intermediate-layer metal wiring at a position above the lower-layer cutout portion, the intermediate-layer cutout portion having a size larger than that of the lower-layer cutout portion; a step of forming a second inter-layer insulating film on the intermediate-layer metal wiring; a step of forming a through hole which extends perpendicularly to a surface of the semiconductor substrate so as to penetrate the insulating film, the lower-layer cutout portion, the first inter-layer insulating film, the intermediate-layer cutout portion and the second inter-layer insulating film, the lower-layer cutout portion and the intermediate-layer cutout portion exposing wall surfaces thereof to the through hole; a step of forming a contact composed of metal material filled in the through hole and connected at a lower end thereof with the semiconductor substrate; and a step of forming an upper-layer metal wiring on the second inter-layer insulating film.

A tenth aspect of the present invention provides a manufacturing method of a semiconductor device comprising: a step of forming an insulating film on a semiconductor substrate; a step of forming a lower-layer metal wiring on the insulating film; a step of forming a first inter-layer insulating film on the lower-layer metal wiring; a step of forming an intermediate-layer metal wiring on the first inter-layer insulating film so that a side surface of the intermediate-layer metal wiring is offset from a side surface of the lower-layer metal wiring; a step of forming a second inter-layer insulating film on the intermediate-layer metal wiring; a step of forming a through hole which extends perpendicularly to a surface of the semiconductor substrate so as to penetrate the insulating film, the first inter-layer insulating film and the second inter-layer insulating film, the lower-layer metal wiring exposing no side surface thereof to the through hole while the intermediate-layer metal wiring exposing the side surface thereof to the through hole; a step of forming a contact composed of metal material filled in the through hole and connected at a lower end thereof with the semiconductor substrate; and a step of forming an upper-layer metal wiring on the second inter-layer insulating film.

An eleventh aspect of the present invention provides a manufacturing method of a semiconductor device comprising: a step of forming an insulating film on a semiconductor substrate; a step of forming a lower-layer metal wiring on the insulating film; a step of forming a first inter-layer insulating film on the lower-layer metal wiring; a step of forming an intermediate-layer metal wiring on the first inter-layer insulating film so that a side surface of the intermediate-layer metal wiring is offset from a side surface of the lower-layer metal wiring; a step of forming a second inter-layer insulating film on the intermediate-layer metal wiring; a step of forming a through hole which extends perpendicularly to a surface of the semiconductor substrate so as to penetrate the insulating film, the first inter-layer insulating film and the second inter-layer insulating film, the lower-layer metal wiring exposing the side surface thereof to the through hole while the intermediate-layer metal wiring exposing no side surface thereof to the through hole; a step of forming a contact composed of metal material filled in the through hole and connected at a lower end thereof with the semiconductor substrate; and a step of forming an upper-layer metal wiring on the second inter-layer insulating film.

A twelfth aspect of the present invention provides a manufacturing method of a semiconductor device comprising: a step of forming an insulating film on a semiconductor substrate; a step of forming a lower-layer metal wiring on the insulating film; a step of forming a first inter-layer insulating film on the lower-layer metal wiring; a step of forming an intermediate-layer metal wiring on the first inter-layer insulating film so that a side surface of the intermediate-layer metal wiring is offset from a side surface of the lower-layer metal wiring; a step of forming a second inter-layer insulating film on the intermediate-layer metal wiring; a step of forming a through hole which extends perpendicularly to a surface of the semiconductor substrate so as to penetrate the insulating film, the first inter-layer insulating film and the second inter-layer insulating film, the lower-layer metal wiring and the intermediate-layer metal wiring exposing the side surfaces thereof to the through hole; a step of forming a contact composed of metal material filled in the through hole and connected at a lower end thereof with the semiconductor substrate; and a step of forming an upper-layer metal wiring on the second inter-layer insulating film.

In the manufacturing methods according to the seventh to twelfth aspects of the present invention, it is preferable that the step of forming the contact is executed, using chemical vapor deposition method, prior to a step of forming an upper-layer metal film for forming the upper-layer metal wiring. By doing so, it becomes possible to provide a semiconductor device having a multi-layer metal wiring structure assuring no disconnection of the contact even if the through hole has a smaller diameter.

Moreover, in the manufacturing methods according to the seventh to twelfth aspects of the present invention, it is preferable that the step of forming the contact is executed in the same step as a step of forming an upper-layer metal film for forming the upper-layer metal wiring. By doing so, it becomes possible to reduce the number of manufacturing steps of a multi-layer metal wiring structure since the steps for forming the contact can be omitted.

BRIEF DESCRIPTION OF THE DRAWINGS

The above and other objects, features and advantages of the present invention will become more apparent from the following detailed description which is to be read in conjunction with the accompanying drawings, in which:

FIGS. 5(a)–5(c) are cross-sectional views showing manufacturing steps of a semiconductor device in accordance with a third embodiment of the present invention;

FIGS. 6(a)–6(d) are cross-sectional views showing manufacturing steps of a semiconductor device in accordance with a fourth embodiment of the present invention;

FIGS. 7 (A-1) to (F-1) and FIGS. 7 (A-2) to (F-2) are views illustrating the existence of exposure condition of each metal wiring layer with respect to the through hole in accordance with the manufacturing methods of the semiconductor devices in accordance with first to fourth embodiments of the present invention;

FIGS. 10(a)–10(i) are cross-sectional views showing manufacturing steps of the first conventional semiconductor device; and FIGS. 11(a)–11(i) are cross-sectional views showing manufacturing steps of the second conventional semiconductor device.

DETAILED DESCRIPTION OF THE PREFERRED EMBODIMENTS

Figure 1A:
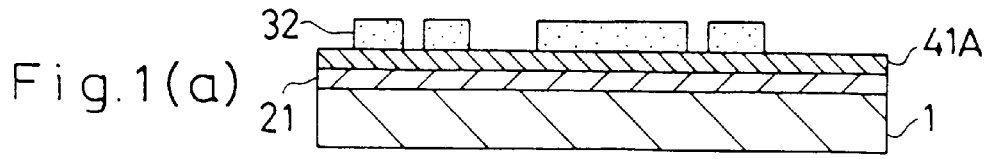
FIGS. 1(a)–1(g) are cross-sectional views showing manufacturing steps of a semiconductor device in accordance with a first embodiment of the present invention.

Hereinafter, preferred embodiments of the present invention will be explained in detail with reference to the accompanying drawings.

First Embodiment

FIGS. 1(a)–1(g) show a semiconductor device and its manufacturing steps in accordance with the first embodiment of the present invention. In the drawings, a reference number 1 denotes a semiconductor substrate, a reference number 21 denotes a BPSG film performing as an insulating film formed on the semiconductor substrate 21, a reference number 41B denotes a first-layer metal wiring performing as a lower-layer metal wiring, a reference number 42B denotes a second-layer metal wiring performing as an intermediate-layer metal wiring, a reference number 43B denotes a third-layer metal wiring performing as an upper-layer metal wiring, a reference number 22 denotes a first inter-layer insulating film isolating the first- and second-layer metal wirings 41B and 42B, a reference number 23 denotes a second inter-layer insulating film isolating the second- and third-layer metal wirings 42B and 43B, a reference number 32 denotes a resist pattern disposed on a first-layer metal film 41A to make the first-layer metal wiring 41B, a reference number 34 denotes a resist pattern disposed on a second-layer metal film 42A to make the second-layer metal wiring 42B, a reference number 35 denotes a resist pattern forming a contact or a through hole connecting the semiconductor substrate 1, the lower-layer metal wiring 41B, the intermediate-layer metal wiring 42B and the upper-layer metal wiring 43B, a reference number 36 denotes a resist pattern disposed on a third-layer metal film 43A to make the third-layer metal wiring 43B, a reference number 50 denotes a through hole extending passing through the BPSG film 21, the first inter-layer insulating film 22 and the second inter-layer insulating film 23, and a reference number 51 denotes a metal contact filled in the through hole 50.

Hereinafter, the manufacturing method of the semiconductor device in accordance with the first embodiment will be explained.

FIGS. 1(a)–1(g) are cross-sectional views showing manufacturing steps of the semiconductor device in accordance with the first embodiment.

First, as illustrated in FIG. 1(a), the semiconductor substrate 1 with the transistor and separating regions is prepared. The BPSG film 21 is formed on this semiconductor substrate 1 by the atmospheric CVD method. Then, the first-layer metal film 41A is formed on the BPSG film 21 using sputtering method, by successively depositing Ti, TiN, aluminum alloy containing several % of Si and Cu, and TiN with thicknesses of several tens nm, 100 nm, 700 nm and 100 nm, respectively. Thereafter the resist pattern 32, configuring the wiring pattern of first-layer metal wiring, is formed on the first-layer metal film 41A.

Figure 1B:
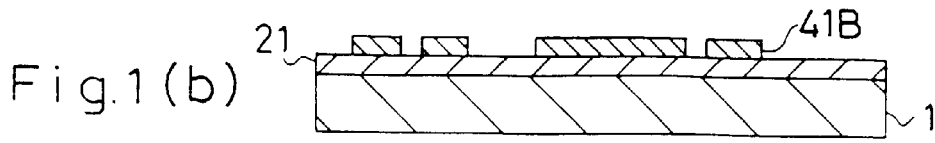

Next, as illustrated in FIG. 1(b), dry etching is applied on the first-layer metal film 41A, leaving the first-layer metal wiring 41B. The resist pattern 32 is then removed and the first-layer metal wiring 41B is cleaned.

Figure 1C:
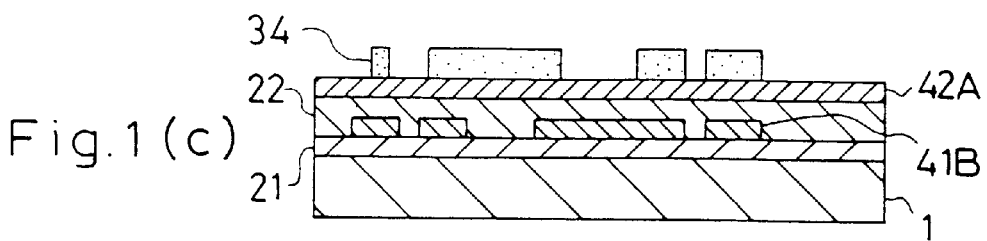

Subsequently, as illustrated in FIG. 1(c), an $SiO_2$ film is formed on the first-layer metal wiring 41B using plasma CVD method. And then, a resist film is formed on the entire surface of the $SiO_2$ film. These resist film and $SiO_2$ film are planarized by etching, thereby forming the first inter-layer insulating film 22. In turn, using sputtering, the second-layer metal film 42A is formed on the first inter-layer insulating film 22 by successively depositing Ti, TiN, aluminum alloy containing several % of Si and Cu, and TiN with thicknesses of several tens nm, 100 nm, 800 nm, and 100 nm, respectively. Thereafter the resist pattern 34, configuring the wiring pattern of second-layer metal wiring, is formed on the second-layer metal film 42A.

Figure 1D:
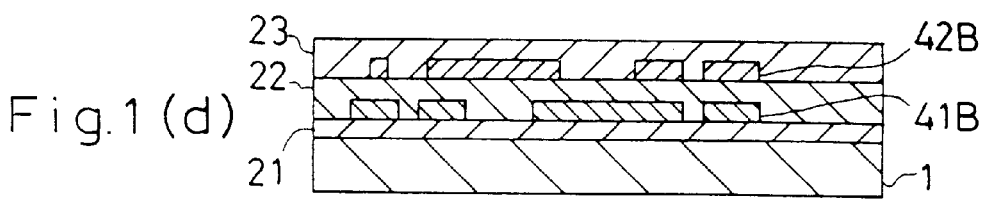

Next, as illustrated in FIG. 1(d), dry etching is applied on the second-layer metal film 42A, leaving the second-layer metal wiring 42B. The resist pattern 34 is then removed and the second-layer metal wiring 42B is cleaned. Subsequently, an $SiO_2$ film is formed on the second-layer metal wiring 42B using plasma CVD method. Then, a resist film is formed on the entire surface of the $SiO_2$ film. These resist film and $SiO_2$ film are planarized by etching, thereby forming the second inter-layer insulating film 23.

Figure 1E:
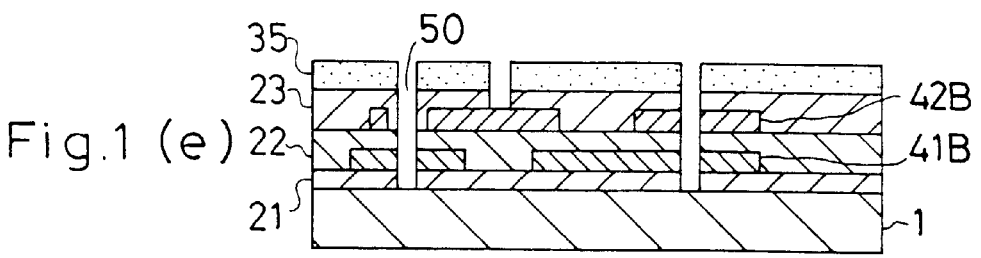

Next, as illustrated in FIG. 1(e), the resist pattern 35, configuring the through hole 50, is formed on the second inter-layer insulating film 23. Thereafter, using the resist pattern 35 as a mask, etching is applied on the second inter-layer insulating film 23, first inter-layer insulating film 22 and BPSG film 21 successively, leaving the through hole 50 penetrating all of them. The resist pattern 35 is then removed and the through hole 50 is cleaned.

When the first-layer metal wiring 41B needs to be electrically isolated from the second-layer metal wiring 42B, a large cutout portion is provided on either of these first- and second-layer metal wirings 41B and 42B at a portion where the through hole 50 passes through, so that the wall surface of the cutout portion is not exposed to the through hole 50. On the contrary, when the first-layer metal wiring 41B needs to be electrically conducted with the second-layer metal wiring 42B, a small cutout portion is provided on either of these first- and second-layer metal wirings 41B and 42B at a portion where the through hole 50 passes through, so that the wall surface of the cutout portion is exposed to the through hole 50. Meanwhile, when the contact needs not be connected to the semiconductor substrate 1, the position of the through hole 50 on the first-layer metal wiring 41B is selected to be on a portion other than the cutout portion.

Figure 1F:
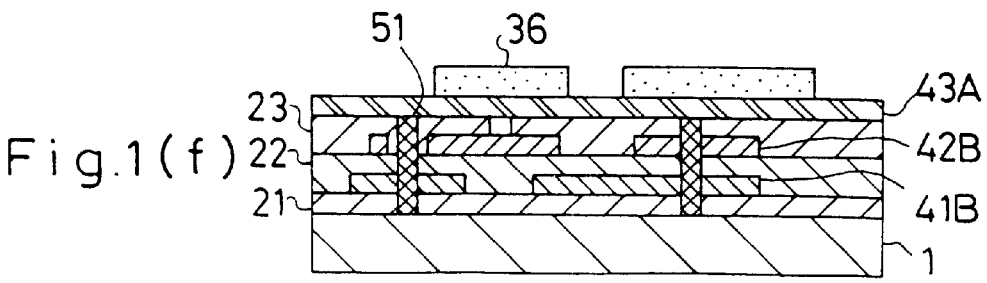

Next, as illustrated in FIG. 1(f), a metal film, containing tungsten (W) as metal material, is formed on the entire surface of the through hole 50 by the CVD method, and then etching is applied on the entire surface of the metal film, thus forming the contact 51 only within the through hole 50.

In turn, using sputtering, the third-layer metal film 43A is formed on the second inter-layer insulating film 23 by successively depositing Ti, TiN, aluminum alloy containing several % of Si and Cu, and TiN with thicknesses of several tens nm, 100 nm, 800 nm, and 100 nm, respectively. Thereafter the resist pattern 36, configuring the wiring pattern of third-layer metal wiring, is formed on the third-layer metal film 43A.

Figure 1G:
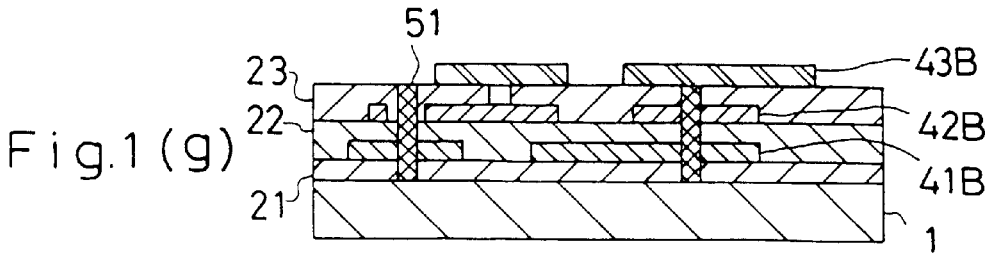

Next, as illustrated in FIG. 1(g), dry etching is applied on the third-layer metal film 43A using a mask of the resist pattern 36, leaving the third-layer metal wiring 43B. The resist pattern 36 is then removed and the third-layer metal wiring 43B is cleaned. Thus, the semiconductor device having a three-layer metal wiring structure is accomplished.

Figure 2:
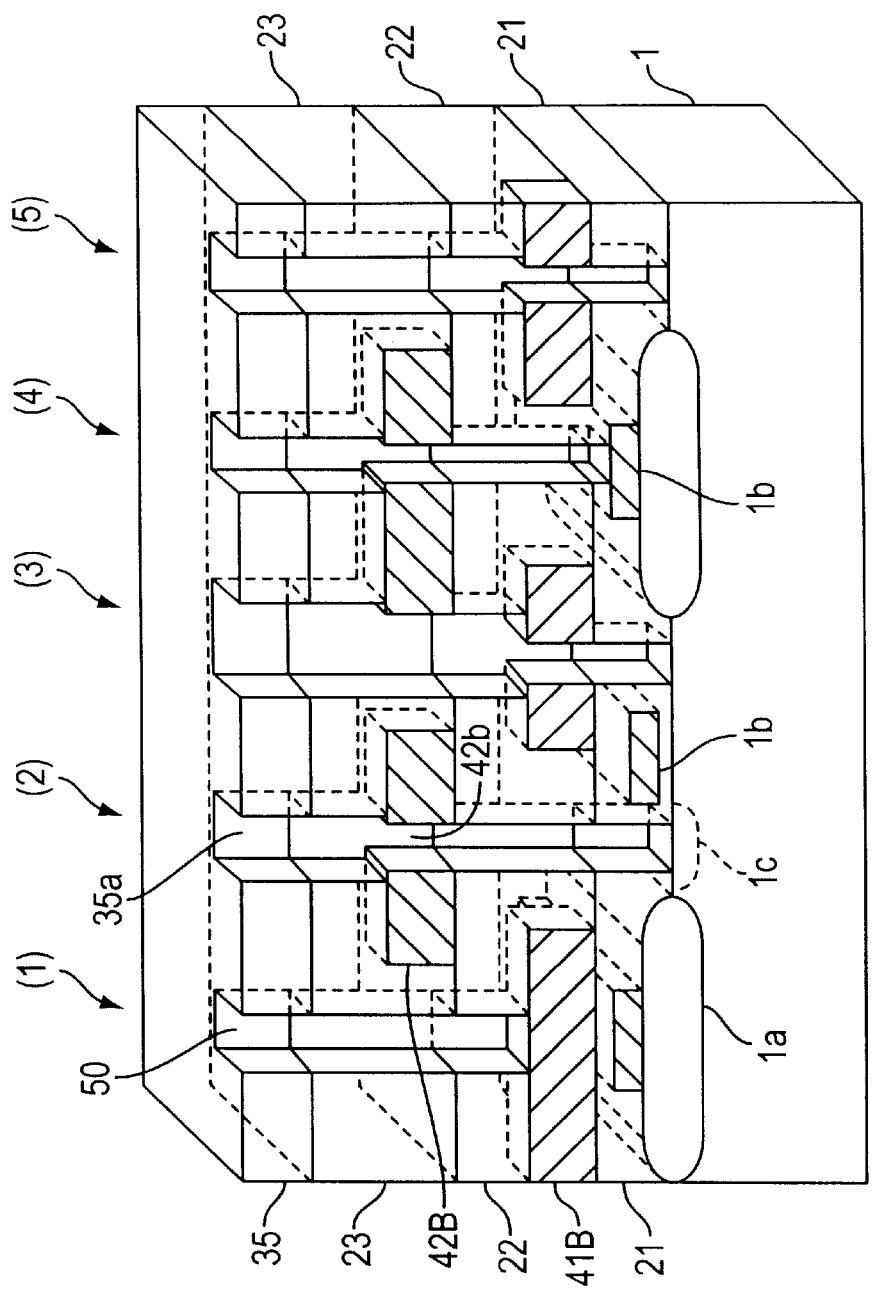
FIG. 2 is a cross-sectional perspective view showing one of the above manufacturing steps of the semiconductor device in accordance with the first embodiment of the present invention, corresponding to the step of FIG. 1(e)

FIG. 2 shows a through hole formation step of FIG. 1(e), wherein the semiconductor substrate 1 is formed with active regions, such as a LOCOS region 1a and a polysilicon electrode 1b serving as a gate. In FIG. 2, reference numbers (1) to (5) represent various connecting patterns of metal wiring.

The reference number (1) denotes a connecting pattern conducting the third-layer metal wiring 43B and the first-layer metal wiring 41B, wherein the through hole 50 is positioned on the first-layer metal wiring 41B. To form this connecting pattern (1), dry etching is applied on the first and second inter-layer insulating films 22 and 23, and stopped when it reaches the first-layer metal wiring 41B.

The reference number (2) denotes a connecting pattern conducting the third-layer metal wiring 43B, second-layer metal wiring 42B and the semiconductor substrate 1. The second-layer metal wiring 42B is formed with a cutout portion 42b whose size is identical with the contact connecting the second-layer metal wiring 42B and the semiconductor substrate 1. An opening portion 35a, provided for forming the contact connecting the third-layer metal wiring 43B and the second-layer metal wiring 42B, has a size slightly larger than that of the cutout portion 42b. With this arrangement, etching applied to the second inter-layer insulating film 23 is blocked by the second-layer metal wiring 42B when it reaches the second-layer metal wiring 42B. Namely, etching is stopped at the region where the second-layer metal wiring 42B is exposed. Thereafter, etching progresses with a region corresponding to the cutout portion 42b through the first inter-layer insulating film 22 and the BPSG film 21 successively until it reaches the semiconductor substrate 1. Formation of the connecting patterns (3), (4) and (5) of FIG. 2 is fundamentally similar to that of the connecting pattern (2) and therefore will be not explained.

Figure 3:
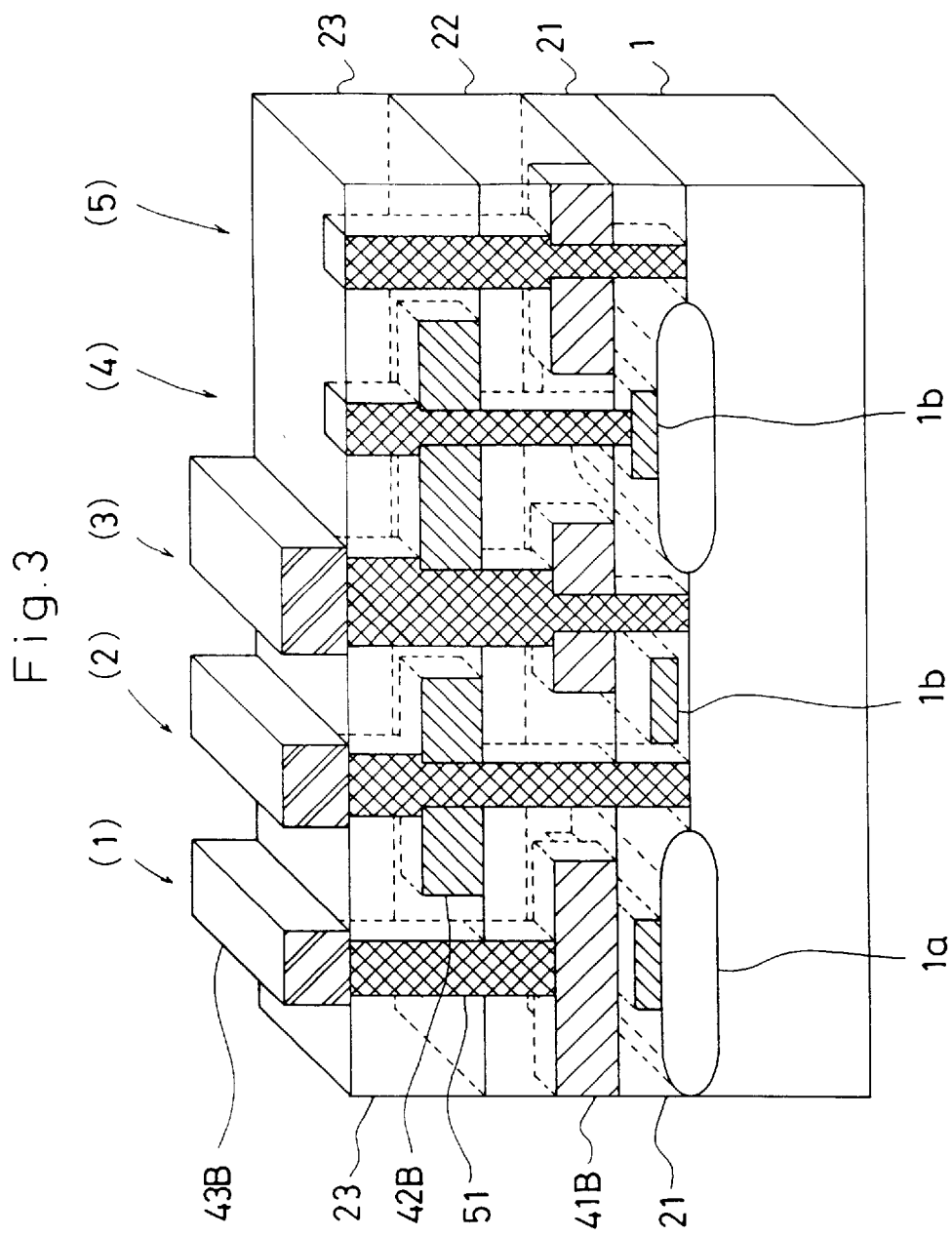
FIG. 3 is a cross-sectional perspective view showing one of the above manufacturing steps of the semiconductor device in accordance with the first embodiment of the present invention, corresponding to the step of FIG. 1(g)

FIG. 3 shows the tungsten filling step of FIG. 1(g). In FIG. 3, a reference number (1) denotes a filling pattern connecting the third-layer metal wiring 43B and the first-layer metal wiring 42B, a reference number (2) denotes a filling pattern connecting the third-layer metal wiring 43B, second-layer metal wiring 42B and the semiconductor substrate 1, a reference number (3) denotes a filling pattern connecting the third-layer metal wiring 43B, second-layer metal wiring 42B, first-layer metal wiring 41B and the semiconductor substrate 1, a reference number (4) denotes a filling pattern connecting the second-layer metal wiring 42B and the semiconductor substrate 1 (i.e. the polysilicon electrode 1b in the drawing), and a reference number (5) denotes a filling pattern connecting the first-layer metal wiring 41B and the semiconductor substrate 1.

According to the above-explained first embodiment, the number of manufacturing steps is reduced from 24 (or up to 27) steps of the conventional method to 19 steps. This brings 20–30% reduction of manufacturing steps for forming a multi-layer metal wiring structure of a semiconductor device, resulting in improvement of productivity. The first embodiment requires only one resist pattern formation for the formation of the contact hole, which is very effective compared with the conventional method requiring at least three resist pattern formations by photolithography using exposure machine. Furthermore, the first embodiment is advantageous in the formation of Ti, TiN and aluminum alloy using sputtering since these Ti, TiN and aluminum alloy can be formed on a semiconductor substrate formed with no contact and through hole. Therefore, a special machine depositing metal in a small hole is no longer required.

Second Embodiment

FIGS. 4(a)–4(g) show a semiconductor device and its manufacturing steps in accordance with the second embodiment of the present invention. In FIGS. 4(a)–4(g), a semiconductor substrate 1, a BPSG film 21 performing as an insulating film, a first-layer metal wiring 41B performing as a lower-layer metal wiring, a second-layer metal wiring 42B performing as an intermediate-layer metal wiring, a third-layer metal wiring 43B performing as an upper-layer metal wiring, a first inter-layer insulating film 22, a second inter-layer insulating film 23, resist patterns 32, 34, 35 and 36, a through hole 50 and a contact 51 are similar to those of the first embodiment and therefore applied the same reference numbers and no more explained.

Hereinafter, the manufacturing method of the semiconductor device in accordance with the second embodiment will be explained with reference to FIGS. 4(a)–4(g).

Figure 4A:
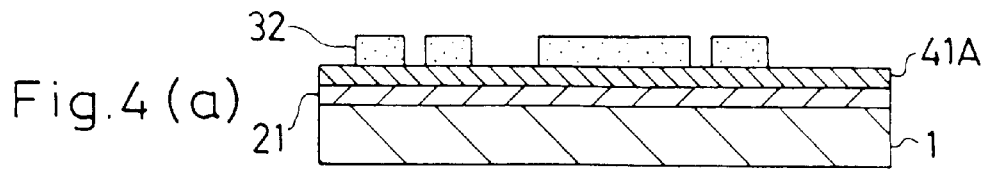
FIGS. 4(a)–4(g) are cross-sectional views showing manufacturing steps of a semiconductor device in accordance with a second embodiment of the present invention.

First, as illustrated in FIG. 4(a), the semiconductor substrate 1 with the transistor and separating regions is prepared. The BPSG film 21 is formed on this semiconductor substrate 1 by the atmospheric CVD method. Then, the first-layer metal film 41A is formed on the BPSG film 21 using sputtering method, by successively depositing Ti, TiN, aluminum alloy containing several % of Si and Cu, and TiN with thicknesses of several tens nm, 100 nm, 700 nm and 100 nm, respectively. Thereafter the resist pattern 32, configuring the wiring pattern of first-layer metal wiring, is formed on the first-layer metal film 41A.

Figure 4B:
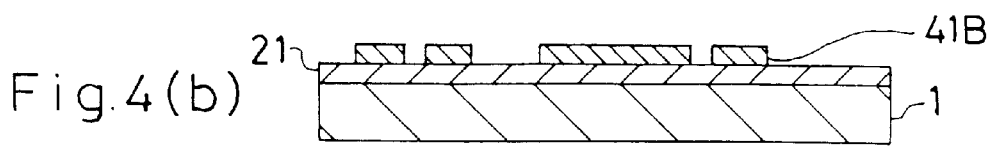

Next, as illustrated in FIG. 4(b), dry etching is applied on the first-layer metal film 41A, leaving the first-layer metal wiring 41B. The resist pattern 32 is then removed and the first-layer metal wiring 41B is cleaned.

Figure 4C:
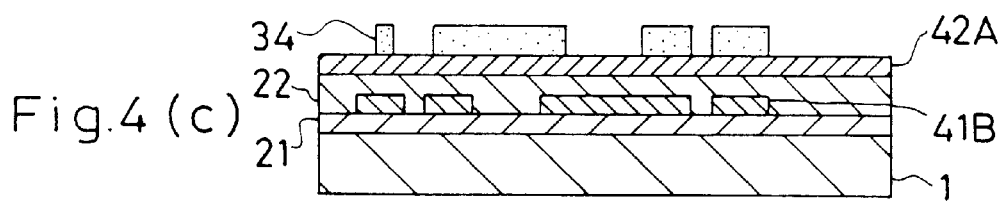

Subsequently, as illustrated in FIG. 4(c), an $SiO_2$ film is formed on the first-layer metal wiring 41B using plasma CVD method. And then, a resist film is formed on the entire surface of the $SiO_2$ film. These resist film and $SiO_2$ film are planarized by etching, thereby forming the first inter-layer insulating film 22. In turn, using sputtering, the second-layer metal film 42A is formed on the first inter-layer insulating film 22 by successively depositing Ti, TiN, aluminum alloy containing several % of Si and Cu, and TiN with thicknesses of several tens nm, 100 nm, 800 nm, and 100 nm, respectively. Thereafter the resist pattern 34, configuring the wiring pattern of second-layer metal wiring, is formed on the second-layer metal film 42A.

Figure 4D:
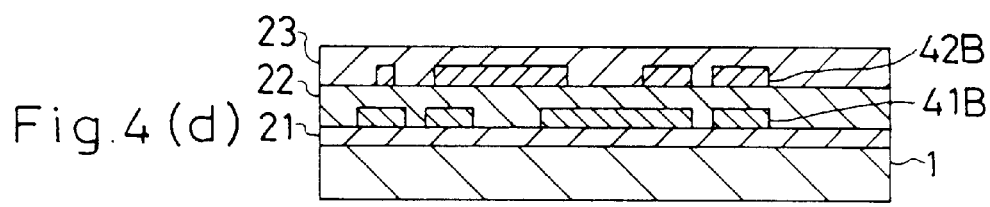

Next, as illustrated in FIG. 4(d), dry etching is applied on the second-layer metal film 42A, leaving the second-layer metal wiring 42B. The resist pattern 34 is then removed and the second-layer metal wiring 42B is cleaned. Subsequently, an $SiO_2$ film is formed on the second-layer metal wiring 42B using plasma CVD method. Then, a resist film is formed on the entire surface of the $SiO_2$ film. These resist film and $SiO_2$ film are planarized by etching, thereby forming the second inter-layer insulating film 23.

Figure 4E:
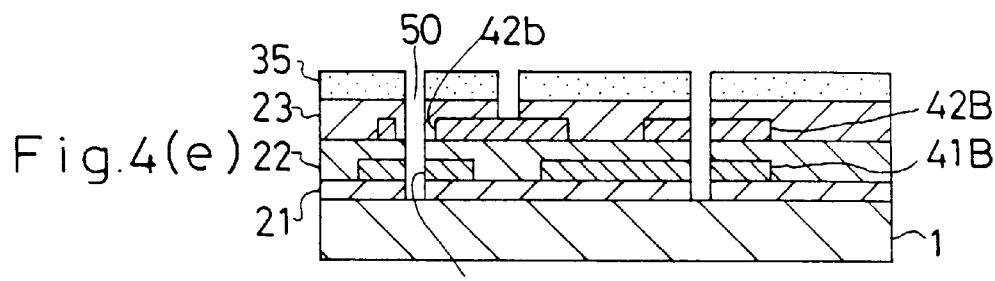

Next, as illustrated in FIG. 4(e), the resist pattern 35, configuring the through hole 50, is formed on the second interlayer insulating film 23. Thereafter, using the resist pattern 35 as a mask, etching is applied on the second inter-layer insulating film 23, first inter-layer insulating film 22 and BPSG film 21 successively, leaving the through hole 50 penetrating all of them. The resist pattern 35 is then removed and the through hole 50 is cleaned.

When the first-layer metal wiring 41B needs to be electrically isolated from the second-layer metal wiring 42B, a large cutout portion 42b is provided on either of these first- and second-layer metal wirings 41B and 42B at a portion where the through hole 50 passes through, so that the wall surface of the cutout portion 42b is not exposed to the through hole 50. On the contrary, when the first-layer metal wiring 41B needs to be electrically conducted with the second-layer metal wiring 42B, a small cutout portion 41b is provided on either of these first- and second-layer metal wirings 41B and 42B at a portion where the through hole 50 passes through, so that the wall surface of the cutout portion 41b is exposed to the through hole 50. Meanwhile, when the contact needs not be connected to the semiconductor substrate 1, the position of the through hole 50 on the first-layer metal wiring 41B is selected to be on a portion other than the cutout portion. (Not shown in the drawings)

Figure 4F:
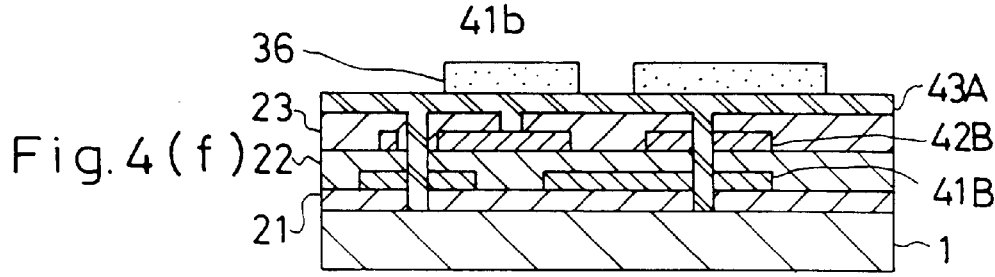

Next, as illustrated in FIG. 4(f), Ti is deposited with several tens nm thickness on the second inter-layer insulating film 23 by sputtering. Thereafter, aluminum alloy containing several % of Si and Cu is deposited with 800 nm thickness on the Ti film, under the conditions that the temperature of the semiconductor substrate 1 is maintained at 400° C., which allows the aluminum alloy to enter and fill the inside space of through hole 50. Subsequently, TiN is deposited with 100 nm thickness on the aluminum alloy film, thus the third-layer metal film 43A is formed. Thereafter the resist pattern 36, configuring the wiring pattern of third-layer metal wiring, is formed on the third-layer metal film 43A.

Figure 4G:
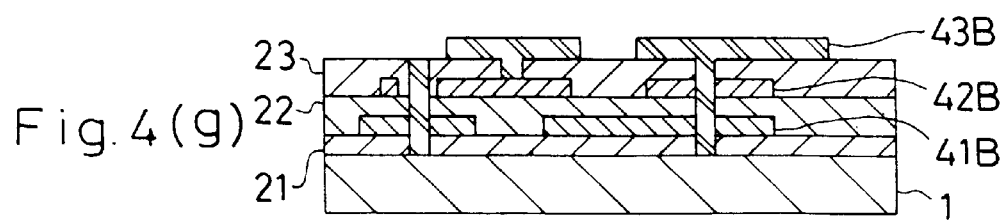

Next, as illustrated in FIG. 4(g), dry etching is applied on the third-layer metal film 43A using a mask of the resist pattern 36, leaving the third-layer metal wiring 43B. The resist pattern 36 is then removed and the third-layer metal wiring 43B is cleaned. Thus, the semiconductor device having a three-layer metal wiring structure is accomplished.

According to the above-explained second embodiment, the number of manufacturing steps is reduced from the 24 (or up to 27) steps of the conventional method to 18 steps. This brings 20–30% reduction of manufacturing steps for forming a multi-layer metal wiring structure of a semiconductor device, resulting in improvement of productivity. The second embodiment requires only four times exposures for the formation of the three-layer metal wiring structure, which is definitely efficient compared with the conventional method requiring at least six times exposures. Thus, productivity is surely improved.

Third Embodiment

FIGS. 5(a)–5(c) show a semiconductor device and its manufacturing steps in accordance with the third embodiment of the present invention.

In FIGS. 5(a)–5(c), a semiconductor substrate 1, a BPSG film 21 performing as an insulating film, a first-layer metal wiring 41B performing as a lower-layer metal wiring, a second-layer metal wiring 42B performing as an intermediate-layer metal wiring, a third-layer metal wiring 43B performing as an upper-layer metal wiring, a first inter-layer insulating film 22, and a second inter-layer insulating film 23 are similar to those of the first embodiment and therefore applied the same reference numbers and no more explained. Reference numbers 41a, 42a and 43a denote metal material filling the contact hole, reference number 24 denotes an insulating film covering the third-layer metal wiring 43B, reference number 37 denotes a resist pattern which configures the contact and through hole connecting the semiconductor substrate 1 and first- to third-layer metal wirings 41B, 42B and 43B.

Hereinafter, the manufacturing method of the semiconductor device in accordance with the third embodiment will be explained with reference to FIGS. 5(a)–5(c).

FIG. 5(a) shows a condition where an insulating film 24 is formed on the second conventional semiconductor device previously described. FIGS. 5(b) and 5(c) illustrate the method of forming an additional electrical connection on the semiconductor device shown in FIG. 5(a).

Next, as illustrated in FIG. 5(b), the resist pattern 37, formed with an opening at a desired position, is formed on the insulating film 24. Then, etching is successively applied on the insulating film 24, second and first inter-layer insulating films 23 and 22, and the insulating film 21, until it reaches a desired depth. In this case, a metal to be connected with the contact is exposed to the through hole 50 through the etching applied.

Subsequently, as illustrated in FIG. 5(c), the resist pattern 37 is removed and the through hole 50 is cleaned. The through hole 50 is then filled with metal material to form the contact.

As described in the foregoing description, the third embodiment allows, after the semiconductor device is completely constructed, to add a desirable connecting pattern thereon as occasion demands, which assures the realization of a high performance semiconductor device by simply modifying properties of a once-completed semiconductor device.

Fourth Embodiment

FIGS. 6(a)–6(d) show a semiconductor device and its manufacturing steps in accordance with the fourth embodiment of the present invention, which is different from the third embodiment in additionally providing a resist pattern 38, cutting a metal wiring, as shown in FIG. 6(d).

First, as illustrated in FIGS. 6(a)–6(c), the same procedure as the steps of the third embodiment explained with reference to FIGS. 5(a)–5(c) is executed. After that, as illustrated in FIG. 6(d), the resist pattern 38 with an opening for cutting an unnecessary portion of the metal wiring is formed, followed by etching partly removing the unnecessary portions of the insulating film 24 and the third-layer metal wiring 43B.

As explained in the foregoing description, the fourth embodiment allows, after the semiconductor device is completely constructed, not only adding a desirable connecting pattern thereon but cutting an unnecessary wiring portion as occasion demands, which assures the realization of a high performance semiconductor device by simply modifying properties of a once-completed semiconductor device.

FIGS. 7 (A-1) to (F-1) and (A-2) to (F-2) show various examples of simple formation of a contact or through hole connecting metal wire layers in a multi-layer metal wiring structure. FIGS. 7 (A-1) to (F-1) are plan views only showing the metal wiring 41B, 42B and 43B, and the contact extending normal to the sheet. FIGS. 7 (A-2) to (F-2) are sectional views taken along a center line of each of FIGS. 7 (A-1) to (F-1).

FIGS. (A-1) and (A-2) show a connecting pattern conducting the first-layer metal wiring 41B and the semiconductor substrate 1, FIGS. (B-1) and (B-2) show a connecting pattern conducting the second-layer metal wiring 42B and the semiconductor substrate 1, FIGS. (C-1) and (C-2) show a connecting pattern conducting the third-layer metal wiring 43B and the semiconductor substrate 1, FIGS. (D-1) and (D-2) show a connecting pattern conducting the first-, second- and third-layer metal wiring 41B, 42B and 43B and the semiconductor substrate 1, FIGS. (E-1) and (E-2) show a connecting pattern conducting the first-, second- and third-layer metal wiring 41B, 42B and 43B, and FIGS. (F-1) and (F-2) show a connecting pattern conducting the first- and third-layer metal wiring 41B and 43B.

Fifth Embodiment

Figure 8A:
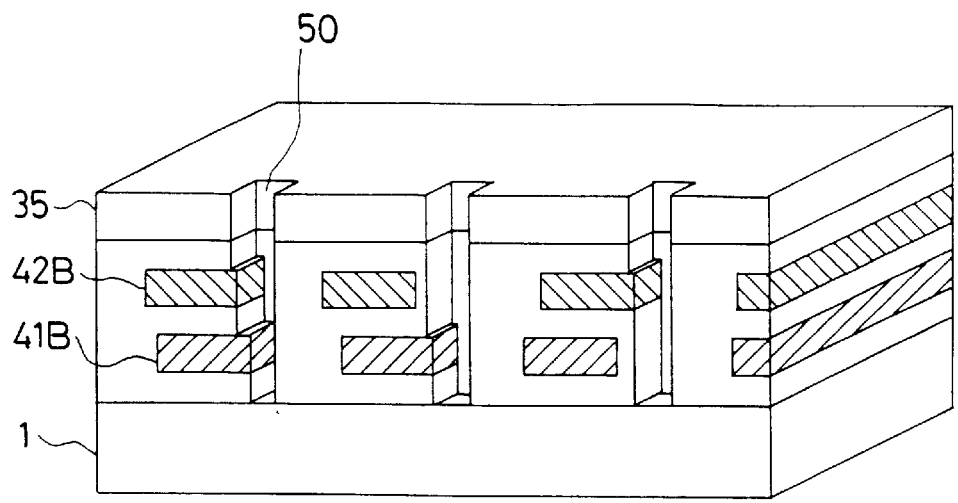
FIGS. 8(a) and 8(b) are cross-sectional perspective views showing manufacturing steps of a semiconductor device in accordance with a fifth embodiment of the present invention.
Figure 8B:
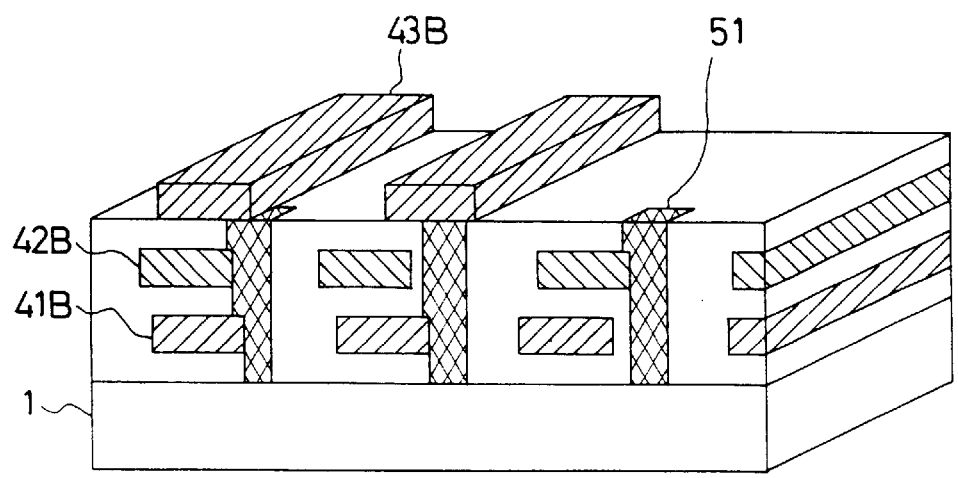
Figure 9:
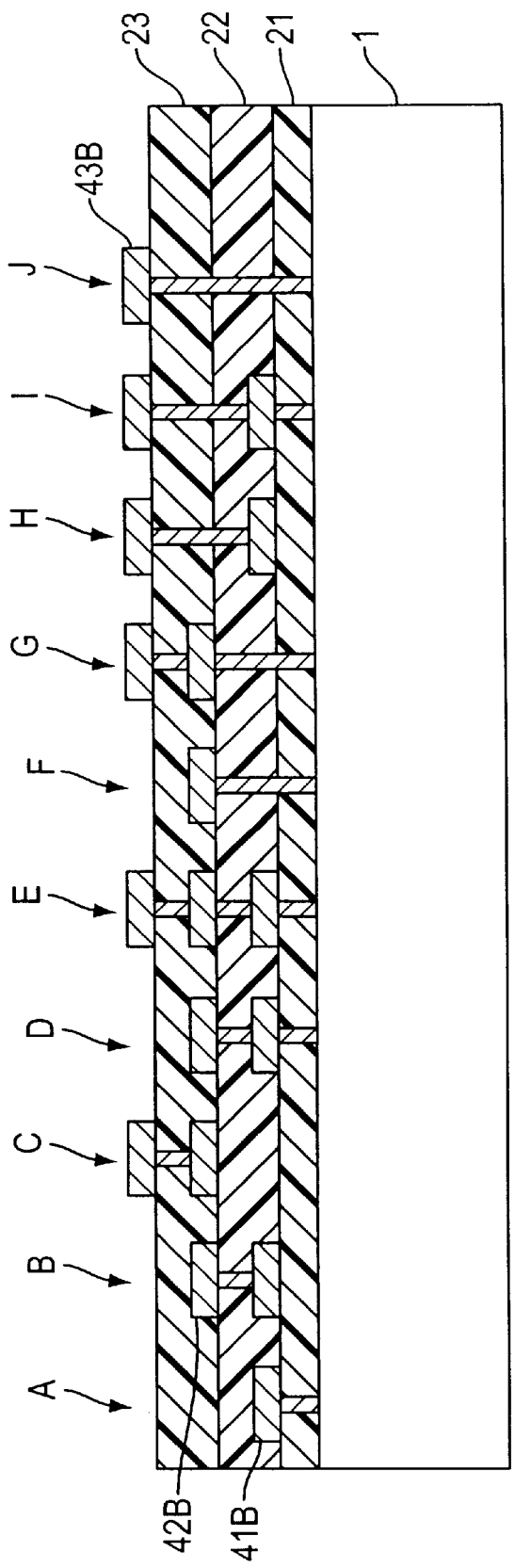
FIG. 9 is a cross-sectional view showing a conventional semiconductor device.

FIGS. 8(a) and 8(b) show a semiconductor device and its manufacturing steps in accordance with the fifth embodiment of the present invention, which is characterized in that metal wiring layers, extending in the back-and-forth direction, are exposed at the side surface (i.e. the right side surface in the drawing) of the semiconductor device. In FIGS. 8(a) and 8(b), a reference number 1 denotes a substrate (or an electrode formed on the substrate) which is electrically isolated, a reference number 41B denotes a first-layer metal wiring performing as a lower-layer metal wiring, a reference number 42B denotes a second-layer metal wiring performing as an intermediate-layer metal wiring, a reference number 43B denotes a third-layer metal wiring performing as an upper-layer metal wiring, and a reference number 51 denotes metal material filling the through hole 50 to electrically conduct the semiconductor substrate 1 and the first- to third-layer metal wirings 41B, 42B and 43B.

Hereinafter, the manufacturing method of the semiconductor device in accordance with the fifth embodiment will be explained with reference to FIGS. 8(a) and 8(b).

First, as illustrated in FIG. 8(a), after an insulating layer is provided on the second-layer metal wiring 42B, the through hole 50 is opened using a resist pattern 35 at a desired position on the insulating layer. The metal wiring, to be electrically connected to the contact, exposes its surface to the through hole 50. With this arrangement, the contact 51 and the third-layer metal wiring 43B are formed as shown in FIG. 8(b), thus enabling any two or more metal wirings to be electrically connected with each other.

The fifth embodiment is very useful since the position electrically connected can be freely selected, even after the semiconductor device is accomplished, by simply conducting the design of wiring pattern so that the metal wirings are offset each other. Thus, it becomes possible to modify the properties of the semiconductor device any time.

What is claimed is:

1. A manufacturing method of a semiconductor device comprising:
   a step of forming an insulating film on a semiconductor substrate;
   a step of forming on said insulating film, a lower-layer metal wiring having a lower-layer cutout portion formed therein at a predetermined position, said lower-layer cutout portion having a wall surface and being formed by severing said lower-layer metal wiring whereby said lower-layer metal wiring is electrically separated by said lower-layer cutout portion;
   a step of forming a first inter-layer insulating film covering said lower-layer metal wiring;
   a step of forming on said first inter-layer insulating film, an intermediate-layer metal wiring having an intermediate-layer cutout portion formed therein at a position above said lower-layer cutout portion, said intermediate-layer cutout portion having a wall surface, being formed by removing a portion of said intermediate-layer metal wiring, and being smaller than said lower-layer cutout portion;
   a step of forming a second inter-layer insulating film covering said intermediate-layer metal wiring;
   a step of forming an upper-layer metal wiring on said second inter-layer insulating film;
   a step of forming a through hole extending in a direction perpendicular to a surface of said semiconductor substrate so as to penetrate said insulating film, said 1st inter-layer insulating film, said intermediate-layer cutout portion and said second inter-layer film, wherein said wall surface of said lower-layer cutout portion is not exposed to said through hole, while said wall surface of said intermediate-layer cutout portion is exposed to said through hole; and
   a step of forming a contact comprising a conductive material for filling said through hole, wherein said contact electrically contacts said semiconductor substrate and said exposed wall surface of said intermediate-layer cutout portion.

2. The manufacturing method of a semiconductor device in accordance with claim 1, wherein said step of forming the contact is executed, using chemical vapor deposition method, prior to a step of forming an upper-layer metal film for forming said upper-layer metal wiring.

3. The manufacturing method of a semiconductor device in accordance with claim 1, wherein said step of forming the contact is executed in the same step as a step of forming an upper-layer metal film for forming said upper-layer metal wiring.

4. A manufacturing method of a semiconductor device comprising:
   a step of forming an insulating film on a semiconductor substrate;
   a step of forming on said insulating film, a lower-layer metal wiring having a lower-layer cutout portion formed therein at a predetermined position, said lower-layer cutout portion having a wall surface and being formed by removing a portion of said lower-layer metal wiring;
   a step of forming a first inter-layer insulating film covering said lower-layer metal wiring;
   a step of forming on said first inter-layer insulating film, an intermediate-layer metal wiring having an intermediate-layer cutout portion formed therein at a position above said lower-layer cutout portion, said intermediate-layer cutout portion having a wall surface, being formed by severing said intermediate-layer metal wiring whereby said intermediate-layer metal wiring is electrically separated by said intermediate-layer cutout portion, and being larger than said lower-layer cutout portion;
   a step of forming a second inter-layer insulating film covering said intermediate-layer metal wiring;
   a step of forming an upper-layer metal wiring on said second inter-layer insulating film;
   a step of forming a through hole extending in a direction perpendicular to a surface of said semiconductor substrate so as to penetrate said insulating film, said lower-layer cutout portion, said first inter-layer insulating film, said intermediate-layer cutout portion and said second inter-layer insulating film, wherein said wall surface of said lower-layer cutout portion is exposed to said through hole, while said wall surface of said intermediate-layer cutout portion is not exposed to said through hole; and
   a step of forming a contact comprising a conductive material for filling said through hole wherein said contact electrically contracts said semiconductor substrate and said exposed wall surface of said lower-layer cutout portion.

5. The manufacturing method of a semiconductor device in accordance with claim 4, wherein said step of forming the contact is executed, using chemical vapor deposition method, prior to a step of forming an upper-layer metal film for forming said upper-layer metal wiring.

6. The manufacturing method of a semiconductor device in accordance with claim 4, wherein said step of forming the contact is executed in the same step as a step of forming an upper-layer metal film for forming said upper-layer metal wiring.

7. A manufacturing method of a semiconductor device comprising;
- a step of forming an insulating film of a semiconductor substrate;
- a step of forming on said insulating film, a lower-layer metal wiring having a lower-layer cutout portion formed therein at a predetermined position, said lower-layer cutout portion having a wall surface and being formed by removing a portion of said lower-layer metal wiring;
- a step of forming a first inter-layer insulating film covering said lower-layer metal wiring;
- a step of forming on said first inter-layer insulating film, an intermediate-layer metal wiring having an intermediate-layer cutout portion formed therein at a position above said lower-layer cutout portion, said intermediate-layer cutout portion having a wall surface, being formed by severing said intermediate-layer metal wiring whereby said intermediate-layer metal wiring is electrically separated by said intermediate-layer cutout portion, and being larger than said lower-layer cutout portion;
- a step of forming a second inter-layer insulating film covering said intermediate-layer metal wiring;
- a step of forming an upper-layer metal wiring on said second inter-layer insulating film;
- a step of forming a through hole extending in a direction perpendicular to a surface of said semiconductor substrate so as to penetrate said insulating film, said lower-layer cutout portion, said first inter-layer insulating film, said intermediate-layer cutout portion and said second inter-layer insulating film, wherein said wall surfaces of said lower-layer cutout portion and said intermediate-layer cutout portion are exposed to said through hole; and
- a step of forming a contact comprising a conductive material for filing said through hole, wherein said contact electrically contacts said semiconductor substrate and said exposed wall surfaces of said lower-layer cutout portion and said intermediate-layer cutout portion.

8. The manufacturing method of a semiconductor device in accordance with claim 7, wherein said step of forming the contact is executed, using chemical vapor deposition method, prior to a step of forming an upper-layer metal film for forming said upper-layer metal wiring.

9. The manufacturing method of a semiconductor device in accordance with claim 7, wherein said step of forming the contact is executed in the same step as a step of forming an upper-layer metal film for forming said upper-layer metal wiring.

* * * * *

UNITED STATES PATENT AND TRADEMARK OFFICE
CERTIFICATE OF CORRECTION

PATENT NO.    : 6,022,804
DATED         : February 8, 2000
INVENTOR(S)   : Kousaku Yano et al.

It is certified that error appears in the above-identified patent and that said Letters Patent is hereby corrected as shown below:

<u>Title page,</u>
Item [75], Inventors, change the spelling of the first name of the second inventor from "Tetauya" to -- Tetsuya --.

Signed and Sealed this

Nineteenth Day of August, 2003

JAMES E. ROGAN
*Director of the United States Patent and Trademark Office*